US011366139B2

(12) United States Patent
Hammerschmidt et al.

(10) Patent No.: US 11,366,139 B2
(45) Date of Patent: Jun. 21, 2022

(54) DEVICE AND METHOD FOR MOUNTING A MAGNETIC FIELD SENSOR CHIP ON A BUSBAR

(71) Applicant: Infineon Technologies AG, Neubiberg (DE)

(72) Inventors: Dirk Hammerschmidt, Finkenstein (AT); Robert Hermann, Voelkermarkt (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/944,281

(22) Filed: Jul. 31, 2020

(65) Prior Publication Data

US 2021/0041485 A1 Feb. 11, 2021

(30) Foreign Application Priority Data

Aug. 7, 2019 (DE) .......................... 102019121385.1

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC .... G01R 15/202; G01R 15/207; G01R 15/20; G01R 19/0092
See application file for complete search history.

(56) References Cited

U.S. PATENT DOCUMENTS

| 7,573,274 | B2 | 8/2009 | Uratani | |
|---|---|---|---|---|
| 2007/0279053 | A1* | 12/2007 | Taylor | G01R 15/207 324/252 |
| 2014/0225593 | A1* | 8/2014 | Nakajima | G01R 15/20 324/117 R |
| 2014/0253103 | A1* | 9/2014 | Racz | G01R 1/0416 324/149 |
| 2015/0008009 | A1* | 1/2015 | Vinnedge | H02G 5/025 174/79 |
| 2015/0355241 | A1* | 12/2015 | Kawanami | G01R 15/205 324/117 R |
| 2016/0313373 | A1* | 10/2016 | Plagne | G01R 15/207 |
| 2018/0038898 | A1* | 2/2018 | Shimizu | G01R 33/09 |
| 2018/0188294 | A1* | 7/2018 | Kawanami | G01R 15/202 |
| 2018/0321281 | A1* | 11/2018 | Fukuhara | G01R 15/202 |
| 2019/0178917 | A1* | 6/2019 | Shimizu | G01R 33/07 |

FOREIGN PATENT DOCUMENTS

| DE | 102007034757 A1 | 2/2008 |
|---|---|---|
| DE | 102016217510 A1 | 3/2018 |
| EP | 3048653 A1 | 7/2016 |

* cited by examiner

*Primary Examiner* — Dominic E Hawkins
(74) *Attorney, Agent, or Firm* — Design IP

(57) ABSTRACT

The present disclosure relates to a current measuring system. The current measuring system includes a busbar, a magnetic field sensor chip encased by a sensor housing, wherein a geometry of the sensor housing is independent of a geometry of the busbar; and an adapter piece for receiving the sensor housing, said adapter piece being adapted to the geometry of the busbar, wherein the adapter piece is fixable to the busbar, wherein the magnetic field sensor chip is fixed in a predetermined measurement position when the sensor housing is received into the fixed adapter piece.

18 Claims, 5 Drawing Sheets

DEVICE AND METHOD FOR MOUNTING A MAGNETIC FIELD SENSOR CHIP ON A BUSBAR

FIELD

The present disclosure relates to devices and methods for measuring an electric current through a busbar by means of magnetic field sensors.

BACKGROUND

Devices and methods of this type are of interest for many different applications, such as for measuring electric currents in electric vehicles, for example. Here it is possible to measure electric currents through busbars between battery and drive unit of an electrically driven vehicle. The currents detected can then serve for example as a basis for electric motor and/or battery control systems. The current measurement can be effected by means of magnetic field sensors, for example. Typical magnetic field sensors comprise Hall sensors or magnetoresistive sensors. In order to make measurements robust vis-à-vis magnetic leakage fields, differential magnetic field sensor concepts can be used. In this case, the sensors often have to be tailored to different busbars and/or installation situations, which can result in individual, complex and hence expensive manufacturing processes for sensor devices.

Therefore, there is a need for reduced complexity and costs.

SUMMARY

This is achieved by means of devices and methods as claimed in the independent claims. The dependent claims relate to advantageous developments.

In accordance with a first aspect of the present disclosure, a current measuring system is provided. The current measuring system includes a busbar and a magnetic field sensor IC (IC=integrated circuit) or magnetic field sensor chip encased by a sensor housing. In this case, a geometry of the sensor housing of the chip is independent of a geometry of the busbar. For provision is furthermore made of an adapter piece for receiving the magnetic field sensor chip including the sensor housing, said adapter piece being adapted to the geometry of the busbar, wherein the adapter piece is fixable to the busbar in such a way that the magnetic field sensor chip is fixed in a predetermined measurement position when its sensor housing is received into the fixed adapter piece.

Consequently, the manufacturing process for the magnetic field sensor chip and/or the sensor housing thereof does not need to be individually tailored to different busbars. Adaptations to different busbars and/or installation situations can be effected by way of the adapter piece. The adapter piece can be manufactured as an inexpensive plastic part, for example.

In accordance with some exemplary embodiments, the busbar has an opening or a hole and the adapter piece with the sensor housing received or accommodated therein is fixed in the opening. The adapter piece together with the magnetic field sensor chip can be plugged through the busbar, for example. In accordance with some exemplary embodiments, the adapter piece thus forms one half of a plug connection with the busbar. The outer contour of the adapter piece is adapted to the busbar; the inner contour of the adapter piece is adapted to the sensor housing.

In accordance with some exemplary embodiments, the adapter piece has a first section having a larger external diameter than the opening and a second section, which fits through the opening, such that the adapter piece in the mounted state fixes the magnetic field sensor chip relative to the busbar in the predetermined measurement position. This can be useful in the case of differential magnetic field sensors, in particular, where it is endeavored to position the sensor elements as symmetrically as possible around the busbar.

In accordance with some exemplary embodiments, the magnetic field sensor chip includes at least two magnetic field sensor elements (for example two Hall sensors) for differential magnetic field measurement and the adapter piece can be configured to position the magnetic field sensor elements symmetrically around a current-carrying section of the busbar in the mounted state.

In accordance with some exemplary embodiments, the second section of the adapter piece has an external thread in order to secure the adapter piece to the busbar by means of a nut. In accordance with some exemplary embodiments, the adapter piece additionally or alternatively has a clip mechanism configured to secure the adapter piece to the busbar in a positively locking manner. In this case, clips of the adapter piece can form a latching connection with the busbar.

In accordance with some exemplary embodiments, the adapter piece additionally or alternatively has a clip mechanism configured to hold the sensor housing captively in the adapter piece. In this case, clips of the adapter piece can form a latching connection with the sensor housing. Additionally, or alternatively, the sensor housing can also be adhesively bonded, crimped or shrink-fitted into the adapter piece.

In accordance with some exemplary embodiments, the adapter piece is formed from an electrically insulating material, such as plastic, for example. It can thus additionally insulate the magnetic field sensor chip from the busbar.

A further aspect of the present disclosure relates to a method for current measurement. This involves mounting a magnetic field sensor chip in a busbar-nonspecific sensor chip housing onto a busbar by means of a busbar-specific adapter piece. In accordance with exemplary embodiments, a method for mounting a magnetic field sensor chip onto a busbar includes encasing the magnetic field sensor chip with a sensor housing, the geometry of which is independent of a geometry of the busbar. The sensor housing is accommodated in an adapter piece adapted to the geometry of the busbar. The adapter piece with magnetic field sensor chip is then mounted on or relative to the busbar. An adaptation of the magnetic field sensor chip and/or of the sensor housing to the busbar thus takes place by way of the adapter piece.

In accordance with some exemplary embodiments, the adapter piece fixes the magnetic field sensor chip in the sensor housing in the mounted state relative to the busbar in a predetermined measurement position.

In accordance with some exemplary embodiments, the adapter piece with the sensor housing received therein is fixed in an opening in the busbar.

In accordance with some exemplary embodiments, mounting the adapter piece on or relative to the busbar includes a plug connection between adapter piece and busbar.

BRIEF DESCRIPTION OF THE DRAWINGS

Some examples of devices and/or methods are explained in greater detail merely by way of example below with reference to the accompanying figures, in which.

DETAILED DESCRIPTION

Figure 1A:
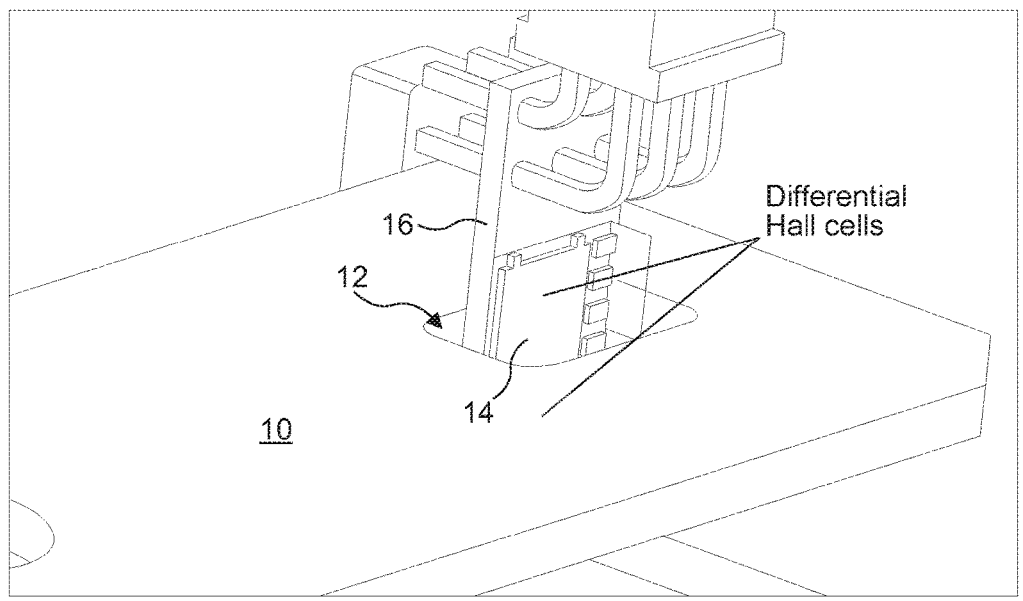
FIGS. 1A and 1B show conventional arrangements of differential magnetic field sensors on busbars.

Various examples will now be described more thoroughly with reference to the accompanying figures, in which some examples are illustrated. In the figures, the thicknesses of lines, layers and/or regions may be exaggerated for elucidation purposes.

While further examples are suitable for various modifications and alternative forms, some specific examples thereof are accordingly shown in the figures and described thoroughly below. However, this detailed description does not limit further examples to the specific forms described. Further examples can cover all modifications, counterparts and alternatives that fall within the scope of the disclosure. Throughout the description of the figures, identical or similar reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B, unless explicitly or implicitly defined otherwise. An alternative wording for the same combinations is "at least one from A and B" or "A and/or B". The same applies, mutatis mutandis, to combinations of more than two elements.

The terminology used here for describing specific examples is not intended to be limiting for further examples. If a singular form, e.g. "a, an" and "the", is used and the use of only a single element is defined neither explicitly nor implicitly as obligatory, further examples can also use plural elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage indicate with greater precision the presence of the specified features, integers, steps, operations, processes, elements, components and/or a group thereof, but do not exclude the presence or the addition of one or more other features, integers, steps, operations, processes, elements, components and/or a group thereof.

Unless defined otherwise, all terms (including technical and scientific terms) are used here in their customary meaning in the field with which examples are associated.

Busbars are components for electrical energy supply and serve to guide electrical energy on the basis of a current flow from a first electrical device to a second electrical device, or vice versa. Electrical devices can be electrical consumers, for example, in which electrical energy fed in is used to implement an intended function, and also energy sources, such as, for example, electrical generators on the basis of electrical machines, optoelectrical transducers such as, for example, solar cells or the like, fuel cells and/or the like. Busbars have a suitable mechanical strength besides a high electrical conductivity, with the result that the influence of mechanical forces such as can occur in the case of overcurrents, for example, can be carried by the busbar without the intended function thereof being significantly impaired. Furthermore, busbars often have a high thermal loading capacity, with the result that they implement their intended function substantially reliably even in thermally exposed regions. A busbar generally has a main body composed of an electrically conductive material, which provides connections for the electrical devices such as the first and second electrical devices. The material used is often a metal such as aluminum, copper, alloys thereof, optionally with further metals, and/or the like. Busbars are not only used in stationary energy distribution, but moreover are also found in electrical installations of vehicles and further electrical devices in which electrical energy is distributed in particular to a relatively great extent.

Some conventional systems for current measurement in busbars with differential magnetic field sensors use sensors mounted by a printed circuit board together with a plug. Conventional current measuring arrangements of this type are shown in FIGS. 1A and 1B.

FIG. 1A shows a busbar 10 having a hole 12 provided in the busbar. A differential magnetic field sensor 14 having differential Hall cells including a printed circuit board 16 is arranged in the hole within the busbar 10 such that one sensor cell is situated above the upper surface of the busbar and another sensor cell is situated symmetrically with respect thereto below the lower surface of the busbar. The magnetic field sensor 14 including the printed circuit board 16 is typically encapsulated by injection molding in order to insulate the magnetic field sensor 14 from the busbar 10 and to protect it from environmental influences.

Figure 1B:
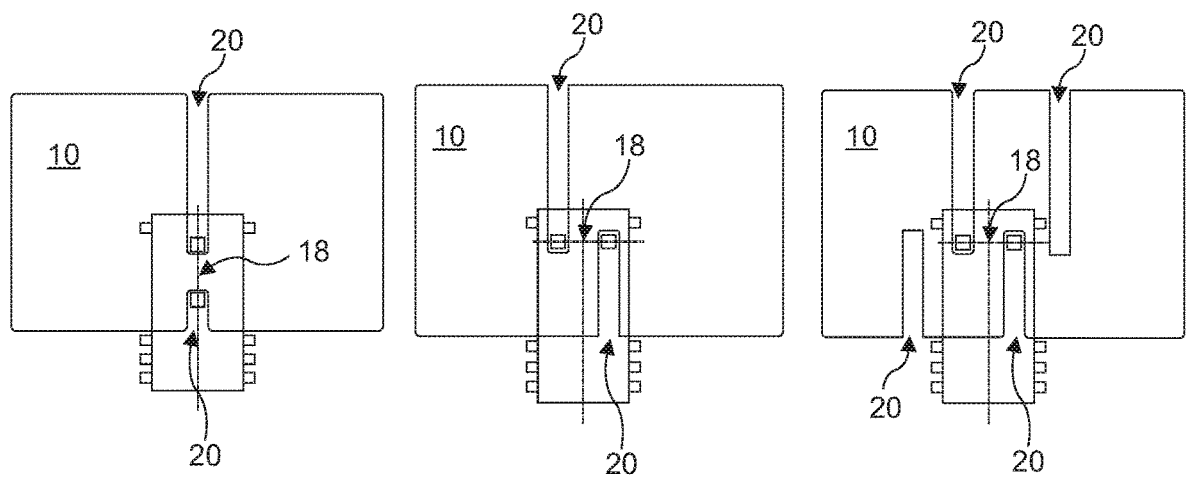

FIG. 1B shows various alternative arrangements of magnetic field sensors and busbars, in each of which a current-carrying region 18 of the busbar 10 is narrowed by slots 20 introduced perpendicularly to the longitudinal axis of the busbar. The differential magnetic field sensor 14 is positioned in each case on the surface of the busbar 10. The two Hall cells are situated in each case in proximity to the ends of the slots 20 that constrict the current-carrying cross section of the busbar. One disadvantage of such conventional implementations can be seen in the increase in the resistance of the busbar.

What the known measuring systems shown in FIGS. 1A and 1B have in common is that the magnetic field sensors have to be adapted in each case to the busbar and/or a specific installation situation. This is complex and thus costly.

Against this background, the present disclosure provides a concept for current measurement on busbars in which, for current measurement, a magnetic field sensor chip in a busbar-nonspecific sensor chip housing can be mounted onto a busbar by means of a busbar-specific adapter piece. Consequently, there is no need for the magnetic field sensor chip and/or the sensor chip housing to be adapted to a specific application. That is done instead by means of the adapter piece, which can be manufactured from plastic in a cost-effective manner.

Figure 2A:
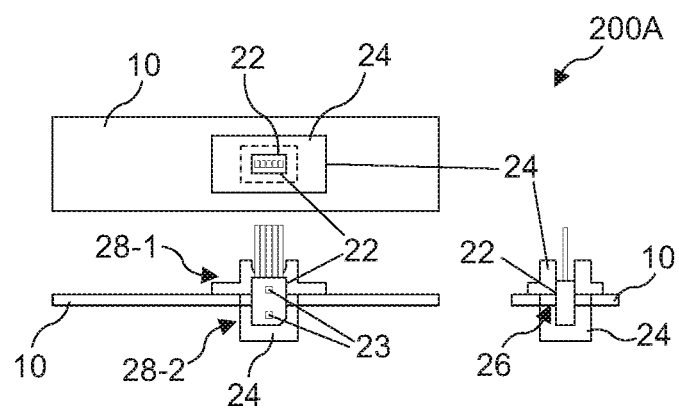
FIGS. 2A-2C show current measuring systems with adapter pieces in accordance with the present disclosure.

FIG. 2A shows a first exemplary embodiment of a current measuring system 200A in accordance with the present disclosure in plan view, side view and front view.

The current measuring system 200A comprises a busbar 10 and a magnetic field sensor chip 23 encased by a sensor housing 22. By way of example, the magnetic field sensor chip 23 can comprise one or a plurality of Hall sensors. A geometry of the sensor housing 22 is independent of the geometry of the busbar 10. To put it another way, the sensor housing is not adapted to the busbar 10 or a specific installation situation, as a result of which standardized and thus more cost-effective manufacture of the magnetic field sensor is made possible. Instead of the magnetic field sensor 22, 23 being adapted to the busbar 10 or the installation situation, provision is made of an adapter piece 24 for receiving the magnetic field sensor chip 23 including the sensor housing 22, said adapter piece being adapted to the geometry of the busbar 10 or the installation situation. The adapter piece 24 is fixable to the busbar 10 in such a way that the magnetic field sensor chip is fixed in a predetermined measurement position when the magnetic field sensor chip 23 including the sensor housing 22 is received into the adapter piece 24 fixed to the busbar 10.

In the exemplary embodiment shown in FIG. 2A, the busbar 10 has an opening or a hole 26, in which the adapter piece 24 with the sensor housing 22 accommodated therein can be fixed. For this purpose, part of the adapter piece 24 can be pushed through the opening 26 in the busbar 10 and be fixed by positively locking engagement, for example.

In the exemplary embodiment shown in FIG. 2A, the adapter piece has a first (upper) section 28-1 having larger external dimensions than the opening 26, and a second (lower) section 28-2 which fits through the opening 26, such that the adapter piece 24 in the mounted state fixes the magnetic field sensor chip 23 relative to the busbar 10 in the predetermined measurement position.

The sensor housing 22 can be adhesively bonded, crimped or shrink-fitted into the adapter piece 24. Alternatively, a releasable connection is also conceivable, for example by means of a clip mechanism.

The magnetic field sensor chip 23 can thus be packaged in a standard housing 22, which is adhesively bonded or clipped into the adapter piece 24 (e.g. composed of plastic). The plastic adapter piece is configured such that it fits into the hole 26 in the busbar 10 and fixes the differential magnetic field probes in the desired measurement position.

For functional reliability, the adapter piece 24 can be configured such that it fixes two redundant magnetic field sensor chips 23 at positions at which they can measure correlated magnetic fields in order, by means of comparison of the measured values, to be able to identify whether one of the magnetic field sensor chips is defective and yields incorrect values. Corresponding examples are shown in FIGS. 2B and 2C.

Figure 2B:
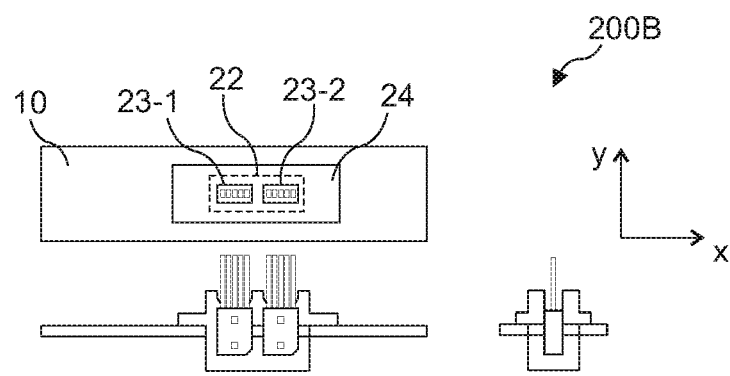
Figure 2C:
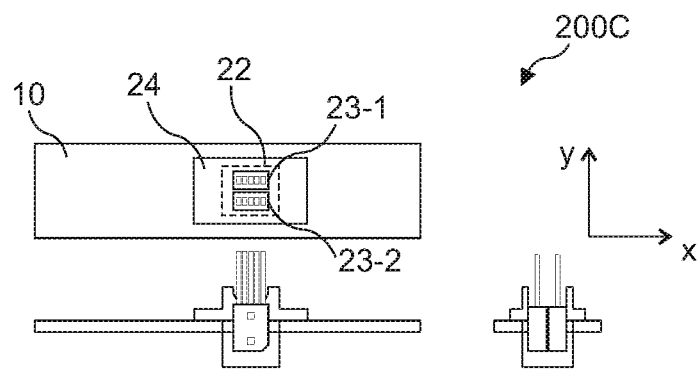

FIG. 2B shows, in plan view, side view and front view, a current measuring system 200B having two magnetic field sensor chips 23-1 and 23-2 arranged next to one another along the x-direction in a common adapter piece 24. In this case, the x-direction denotes the longitudinal direction of the busbar. FIG. 2C shows, in plan view, side view and front view, a current measuring system 200C having two magnetic field sensor chips 23-1 and 23-2 arranged next to one another along the y-direction in a common adapter piece 24. The two magnetic field sensor chips 23-1 and 23-2 are also accommodated in each case in a common sensor housing 22.

Figure 3A:
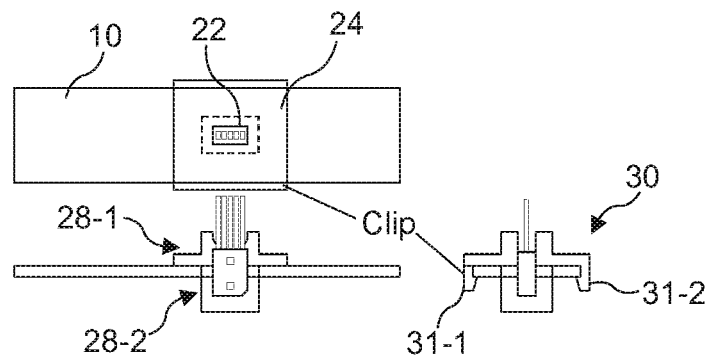
FIGS. 3A-3C show various mechanisms for securing an adapter piece to a busbar.
Figure 3B:
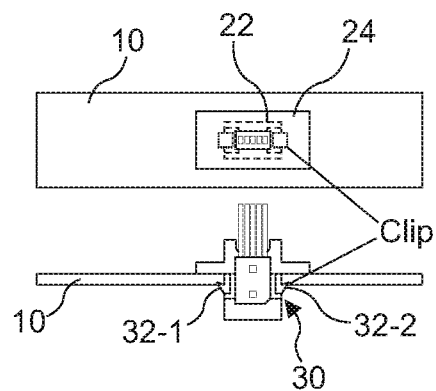
Figure 3C:
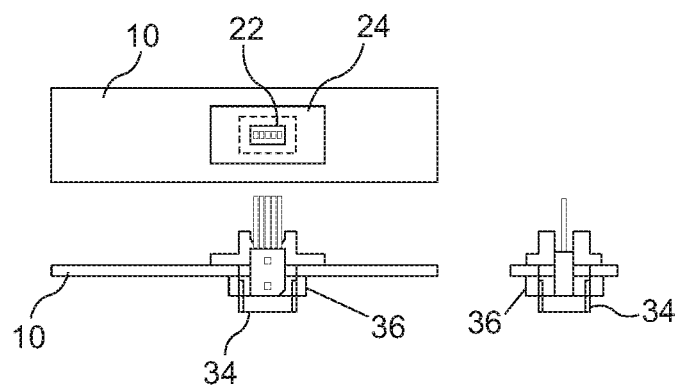

FIGS. 3A-C show various mechanisms for securing an adapter piece 24 to the busbar 10.

For mechanical securing, the adapter 24, which holds the sensor 23 in its measurement position, can be plugged over the busbar 10. In the embodiments in FIG. 3A and 3B, the adapter piece 24 has for this purpose in each case a clip mechanism 30 configured to secure the adapter piece 24 to the busbar 10 in a positively locking manner. In accordance with FIG. 3A, the first (upper) section 28-1 of the adapter piece 24 engages around the longitudinal edges of the busbar piece 10 with clips 31-1, 31-2, which can latch in place on the underside of the busbar 10 in order to establish a positively locking connection between adapter piece 24 and busbar 10. In accordance with FIG. 3B, from the first (upper) section 28-1 of the adapter piece 24 along an edge of the opening 26 one or a plurality of clips 32 extend through the opening and can latch in place on the underside of the busbar 10 in order to establish a positively locking connection between adapter piece 24 and busbar 10.

In accordance with the embodiment illustrated in FIG. 3C, the second (lower) section 28-2 of the adapter piece 24 has an external thread 34 for securing the adapter piece 24 to the busbar by means of a nut 36. Just like the adapter piece 24 itself, the nut 36 can also be manufactured from plastic. The first (upper) section 28-1 of the adapter piece 24 with its larger diameter then acts in a manner similar to a screw head. The busbar 10 is fixed between nut 36 and section 28-1.

Figure 4A:
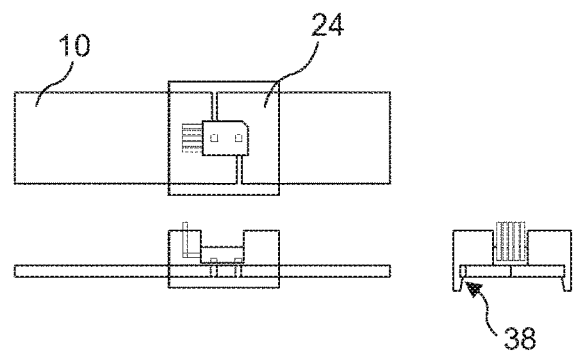
FIG. 4A shows a securing variant for slotted busbars.

FIG. 4A shows a securing variant for slotted busbars. The busbar 10 illustrated here has two slots 20, which are offset in the x-direction and run in each case in the y-direction, in a manner similar to FIG. 1B (center). In order to place the sensitive regions of the magnetic field sensor chip 23 correctly over the slots 20, the adapter 24 can have on its rear side, for example, means 38 (for example rods) which can engage into the slots 20 of the busbar 10 and correctly position the magnetic field sensor chip 23 received in the adapter relative to the busbar 10.

Figure 4B:
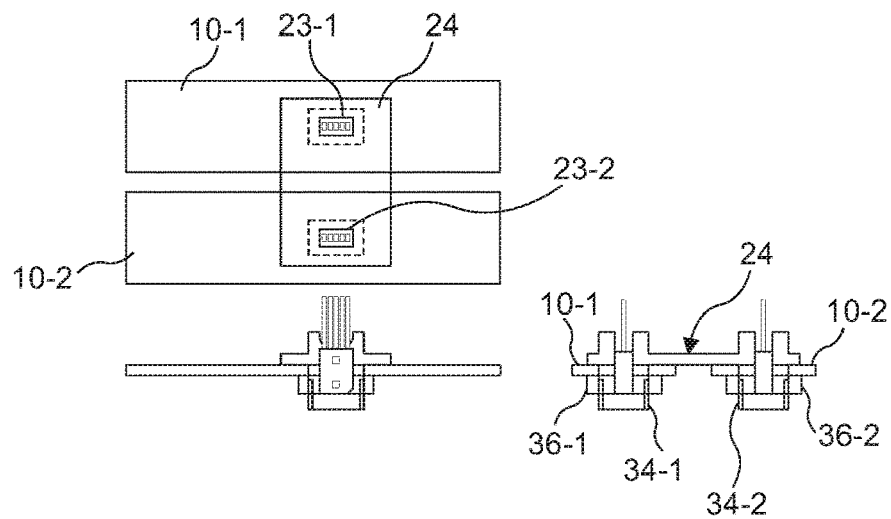
FIG. 4B shows an adapter for two busbars running parallel.

FIG. 4B shows an embodiment with an adapter 24 for two busbars 10-1, 10-2 running parallel. For this purpose, the adapter 24 is lengthened in the y-direction, such that it extends over both busbars 10-1, 10-2. The adapter 24 has two receiving regions for magnetic field sensor chips 23-1, 23-2 including housings, such that the magnetic field sensor chips 23-1, 23-2 are fixed in predetermined measurement positions relative to the busbars 10-1, 10-2 when the sensor housings thereof are received into the adapter piece 24. For this purpose, in the embodiment illustrated in FIG. 4B, the lower sections of the receiving regions of the adapter piece 24 respectively have an external thread 34-1, 34-2 in order to secure the adapter piece 24 to the busbars 10-1, 10-2 by means of nuts 36-1, 36-2.

Figure 4C:
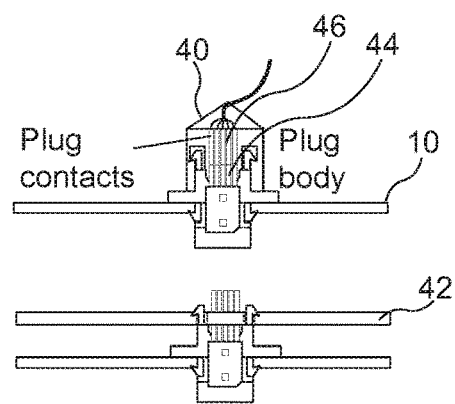
FIG. 4C shows an adapter piece for latching into a plug counterpart or a printed circuit board.

As illustrated in FIG. 4C, the adapter piece 24 can also be prepared for latching into a plug counterpart 40 or a printed circuit board 42 for the connection of the magnetic field sensor to a control unit. In the case of a plug, lines 44 of the magnetic field sensor 23 can be part of a contact mechanism between magnetic field sensor 23 and plug 40 and can make contact with contacts 46 of the plug 40, which can be springs in order to press against the lines 44.

Figure 5:
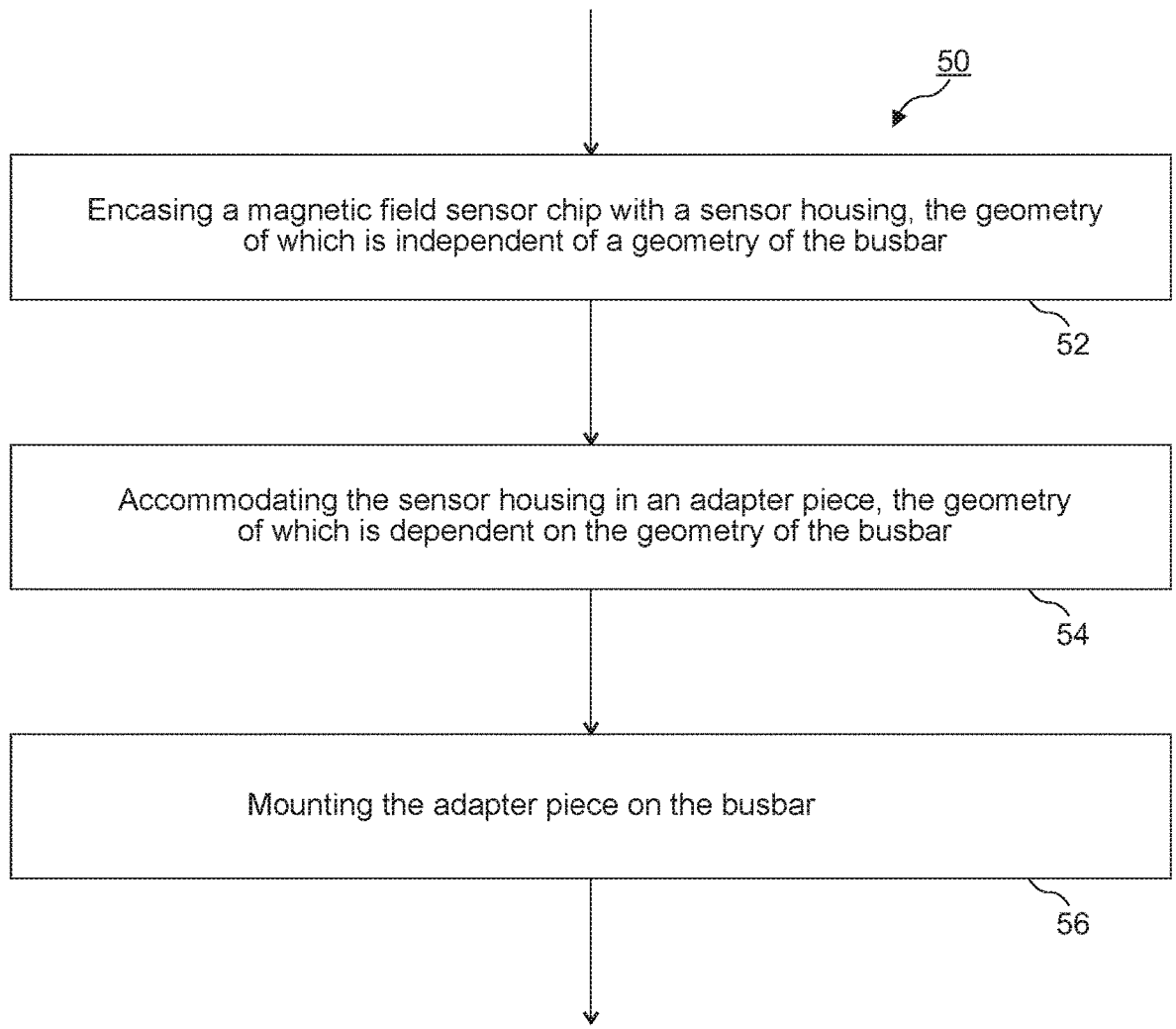
FIG. 5 shows a flow diagram of a method for mounting a magnetic field sensor chip on a busbar.

FIG. 5 illustrates in summary a flow diagram of a method 50 for mounting a magnetic field sensor chip 23 on a busbar 10. The magnetic field sensor chip 23 is firstly encased with a sensor housing 24 (reference sign 52), the geometry of which is independent of a geometry of the busbar. The magnetic field sensor chip 23 including the sensor housing 24 is accommodated in an adapter piece (reference sign 54), the geometry of which is adapted to the geometry of the busbar. The adapter piece is mounted on or relative to the busbar (reference sign 56).

Aspects and features that have been described together with one or more of the examples and figures described in detail above can also be combined with one or more of the other examples in order to replace an identical feature of the other example or in order additionally to introduce the feature into the other example.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

A function block designated as means for implementing a specific function can relate to a circuit configured for implementing a specific function. A "means for something" can thus be implemented as a "means configured for or suitable for something", e.g. a component or a circuit configured for or suitable for the respective task.

It goes without saying that the disclosure of a plurality of steps, processes, operations or functions disclosed in the description or the claims should not be interpreted as being in the specific order, unless this is explicitly or implicitly indicated otherwise, for example for technical reasons. The disclosure of a plurality of steps or functions therefore does not limit them to a specific order unless said steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of said individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A current measuring system, comprising:
a busbar comprising a through-hole formed therethrough, wherein the through-hole has a closed contour that is defined by at least one internal sidewall of the busbar that fully encloses the through-hole within the busbar;
a magnetic field sensor chip encased by a sensor housing, wherein a geometry of the sensor housing is independent of a geometry of the at least one internal sidewall that defines the closed contour of the through-hole; and
an adapter piece configured to receive the sensor housing, the adapter piece being adapted to the geometry of the at least one internal sidewall, wherein the adapter piece is inserted into the through-hole such that it extends therethrough and is accommodated within the through-hole, wherein the adapter piece is fixed to the busbar including being in contact with the at least one internal sidewall of the busbar, wherein the magnetic field sensor chip is fixed in a predetermined measurement position when the sensor housing is received into the fixed adapter piece.

2. The current measuring system as claimed in claim 1, wherein the adapter piece has an outer contour adapted to the closed contour of the through-hole of the busbar and an inner contour adapted to the geometry of the sensor housing.

3. The current measuring system as claimed in claim 1, wherein the adapter piece has a first section having a larger external diameter than the closed contour of the through-hole and a second section, which fits through the through-hole such that the adapter piece in the mounted state fixes the magnetic field sensor chip relative to the busbar in the predetermined measurement position.

4. The current measuring system as claimed in claim 3, wherein the second section has an external thread in order to secure the adapter piece to the busbar by means of a nut.

5. The current measuring system as claimed in claim 3, wherein:
the busbar includes a first main surface and a second main surface with the through-hole extending therebetween, and
the first section of the adapter piece is arranged on the first main surface, and the second section of the adapter piece extends from the first section through the through-hole.

6. The current measuring system as claimed in claim 5, wherein the second section of the adapter piece protrudes from the through-hole beyond the second main surface.

7. The current measuring system as claimed in claim 1, wherein the adapter piece has a clip mechanism configured to secure the adapter piece to the busbar in a positively locking manner.

8. The current measuring system as claimed in claim 7, wherein:
the busbar includes a first main surface and a second main surface with the through-hole extending therebetween, wherein the adapter piece is inserted into the through-hole at the first main surface,
the clip mechanism is configured to mechanically engage with the at least one internal sidewall and the second main surface of the busbar.

9. The current measuring system as claimed in claim 1, wherein the adapter piece has a clip mechanism configured to hold the sensor housing captively in the adapter piece.

10. The current measuring system as claimed in claim 1, wherein the adapter piece is formed from an electrically insulating material.

11. The current measuring system as claimed in claim 1, wherein the magnetic field sensor chip comprises at least two magnetic field sensor elements for differential magnetic field measurement and the adapter piece is configured to position the magnetic field sensor elements symmetrically around a current-carrying section of the busbar when the magnetic field sensor chip is fixed in the predetermined measurement position.

12. The current measuring system as claimed in claim 11, wherein:
the busbar includes a first main surface and a second main surface with the through-hole extending therebetween, and
the at least two magnetic field sensor elements include a first magnetic field sensor element and a second magnetic field sensor element that are differentially displaced from each other at opposite ends of the through-hole such that the first magnetic field sensor element is arranged above the first main surface and the second magnetic field sensor element is arranged below the second main surface.

13. A method for current measurement, comprising:

mounting a magnetic field sensor chip in a sensor chip housing onto a busbar by means of an adapter piece, wherein the busbar comprises a through-hole formed therethrough, and wherein the through-hole has a closed contour that is defined by at least one internal sidewall of the busbar that fully encloses the through-hole within the busbar, wherein a geometry of the sensor housing is independent of a geometry of the at least one internal sidewall that defines the closed contour of the through-hole, and wherein a geometry of the adapter piece is dependent on the geometry of the at least one internal sidewall, and wherein mounting the magnetic field sensor chip in the sensor chip housing onto the busbar by means of the adapter piece includes inserting the adapter piece into the through-hole such that it extends therethrough and is accommodated within the through-hole.

14. A method for mounting a magnetic field sensor chip on a busbar, wherein the busbar comprises a through-hole formed therethrough, and wherein the through-hole has a closed contour that is defined by at least one internal sidewall of the busbar that fully encloses the through-hole within the busbar, the method comprising:

encasing the magnetic field sensor chip with a sensor housing, the geometry of which is independent of a geometry of the at least one internal sidewall that defines the closed contour of the through-hole;

accommodating the sensor housing in an adapter piece, the geometry of which is dependent on the geometry of the at least one internal sidewall that defines the closed contour of the through-hole; and mounting the adapter piece on the busbar, including inserting the adapter piece into the through-hole such that it extends therethrough and is accommodated within the through-hole.

15. The method as claimed in claim 14, wherein during mounting the adapter piece, the magnetic field sensor chip is fixed in the sensor housing relative to the busbar in a predetermined measurement position.

16. The method as claimed in claim 14, wherein accommodating the sensor housing in the adapter piece comprises adhesively bonding, crimping, shrink fitting, or clipping the sensor housing into the adapter piece.

17. The method as claimed in claim 14, wherein mounting the adapter piece on the busbar comprises plugging the adapter piece into the through-hole of the busbar.

18. The method as claimed in claim 14, wherein the adapter piece is fixed to the busbar including being in contact with the at least one internal sidewall of the busbar, wherein the magnetic field sensor chip is fixed in a predetermined measurement position when the sensor housing is received into the fixed adapter piece.

* * * * *